United States Patent
Andreaus et al.

(10) Patent No.: US 12,096,545 B2
(45) Date of Patent: Sep. 17, 2024

(54) VACUUM FEEDTHROUGH, ELECTRODE ASSEMBLY, AND DEVICE FOR GENERATING A SILENT PLASMA DISCHARGE

(71) Applicant: INFICON AG, Balzers (LI)

(72) Inventors: Bernhard Andreaus, Rapperswil (CH); Astrid Waldner, Bad Ragaz (CH)

(73) Assignee: INFICON AG, Balzers (LI)

( * ) Notice: Subject to any disclaimer, the term of this patent is extended or adjusted under 35 U.S.C. 154(b) by 0 days.

(21) Appl. No.: 18/285,201

(22) PCT Filed: Mar. 21, 2022

(86) PCT No.: PCT/EP2022/057385
§ 371 (c)(1),
(2) Date: Sep. 29, 2023

(87) PCT Pub. No.: WO2022/207397
PCT Pub. Date: Oct. 6, 2022

(65) Prior Publication Data
US 2024/0196508 A1    Jun. 13, 2024

(30) Foreign Application Priority Data
Mar. 31, 2021  (CH) .................................. 00341/21

(51) Int. Cl.
*H05H 1/24* (2006.01)
*G01L 11/02* (2006.01)
*G01N 21/67* (2006.01)

(52) U.S. Cl.
CPC ........... *H05H 1/2406* (2013.01); *G01L 11/02* (2013.01); *G01N 21/67* (2013.01)

(58) Field of Classification Search
CPC ....... H05H 1/2406; G01L 11/02; G01N 21/67
See application file for complete search history.

(56) References Cited

U.S. PATENT DOCUMENTS

2018/0313763 A1    11/2018  Schwartz et al.
2018/0350564 A1*   12/2018  Vane ................. H01J 37/32596

FOREIGN PATENT DOCUMENTS

EP         3410462 A1    12/2018
WO    2021/052600 A1     3/2021

OTHER PUBLICATIONS

International Search Report (with translation) and Written Opinion received in corresponding International Application No. PCT/EP2022/057385, mailed Jun. 28, 2022, in 16 pages.

* cited by examiner

*Primary Examiner* — Tony Ko
(74) *Attorney, Agent, or Firm* — Procopio, Cory, Hargreaves & Savitch LLP

(57) ABSTRACT

A vacuum feedthrough (10) which is constructed in radial layers comprises the following elements (from inwards to outwards): —a lens element (11), —a first ring (12) made of glass, —a first hollow cylinder (13) made of a first dielectric material, —a first electrically conductive layer (18), —a second hollow cylinder (14) made of glass, —a third hollow cylinder (15) made of ceramic, —a second ring made of glass (16), and—a frame (17) made of metal. On the basis of the vacuum feedthrough, the invention additionally relates to an electrode assembly, to a device for generating a DBD plasma discharge, to a measuring device for characterizing a pressure and/or a gas composition, and to a method for operating the measuring device.

9 Claims, 3 Drawing Sheets

VACUUM FEEDTHROUGH, ELECTRODE ASSEMBLY, AND DEVICE FOR GENERATING A SILENT PLASMA DISCHARGE

CROSS-REFERENCE TO RELATED APPLICATIONS

This application is a U.S. National Stage entry of International Application No: PCT/EP2022/057385, filed Mar. 21, 2022, which claims the benefit of CH 00341/21, filed Mar. 31, 2021, the contents of which are incorporated herein by reference.

The present invention relates to a vacuum feedthrough, an electrode assembly and a device for generating a silent plasma discharge. Further, the invention relates to a measuring device for characterizing a pressure and/or gas composition and a method for operating the measuring device.

The present invention belongs to the technical field of plasma generation, ionization and excitation of molecules and ions to generate plasma light, and further, measurement and evaluation of information about the gas composition of the generated plasma. One possible type of plasma discharge is the so-called DBD plasma discharge. A DBD plasma discharge (also called a silent electrical discharge or dielectric barrier discharge, abbreviated DBD) is an AC gas discharge in which at least one of the electrodes is electrically isolated from the gas space by galvanic separation using a dielectric. It is also referred to as a dielectrically inhibited discharge, since the insulation prevents the occurrence of an arc discharge.

The measurement and evaluation of the light generated in a DBD plasma is associated with many difficulties. Lifetime and, optionally, vacuum suitability of elements, size and complexity of setups as well as the achievable sensitivity are major challenges.

It was the object of the present invention to reduce at least one of the problems of the prior art. Namely, one object of the invention is to enable a compact sensor for pressure and/or gas composition based on a DBD plasma discharge and to provide suitable components for this purpose.

According to the invention, this object is solved by a vacuum feedthrough according to claim 1. Embodiments result from the features of dependent claims 2 to 4.

The vacuum feedthrough comprises the elements of
lens element,
first ring made of glass,
first hollow cylinder made of a first dielectric material,
first electrically conductive layer,
second hollow cylinder made of glass,
third hollow cylinder made of ceramic,
second ring made of glass,
frame made of metal,
in the above sequence radially from the inside to the outside.

The frame can in particular be annular. The frame can in particular be made of stainless steel.

There is at least one continuous radiation path for radiation from an optical wavelength range starting from a first point on a first side, through the lens element to a second point on a second side of the vacuum feedthrough.

The lens element is transparent to at least one wavelength range in the optical wavelength range and thus constitutes the optical portion of the vacuum feedthrough. To the extent that the elements of the vacuum feedthrough are not transparent in said wavelength range, they leave the passage along the at least one continuous radiation path unobstructed. The optical wavelength range comprises electromagnetic radiation with wavelengths from 100 nm to 1 mm, i.e. in particular the ranges of visible light, UV radiation and infrared radiation. The lens element may, for example, have the shape of a plano-convex lens, with the convex side directed towards the first side of the sealing plane. The lens element may, for example, have a mushroom-head-like diameter enlargement on the first side, such that there is a radial overlap with the first ring. In this way, radiation arriving from the first side can be focused. For example, the lens element may be designed by the combination of lens radii and refractive index to concentrate parallel radiation paths arriving from the first side into a focal point, or at least into a focal volume, on the second side.

In particular, the first side may be provided as a vacuum side and the second side may be provided as an atmospheric side. The term vacuum feedthrough, in the context of the present invention, should be understood to mean that the feedthrough is suitable for use in a situation where there is a substantial pressure difference between the first side and the second side without a gas passing through the sealing surface to the other side. This requirement is typical of the use of a feedthrough in vacuum technology, but may also be useful in other applications where there is no pressure in the vacuum range on either side.

The vacuum feedthrough according to the invention is therefore an electrical-optical vacuum feedthrough. The first electrically conductive layer, insulated from the frame, forms the electrical feedthrough. The lens element forms the optical feedthrough.

Optionally, an additional rod-shaped or wire-shaped electrode can be passed through the lens element on a central axis of the lens element, wherein this further electrode can be glazed in by means of a further ring of glass. Such a further electrode can keep the entire structure compact in the event that a power supply for further elements is required.

In one embodiment of the vacuum feedthrough according to the invention, the mutually adjacent elements (elements are the lens element and the further elements from the above list) are connected to each other in a vacuum-tight manner to form a sealing surface which separates a first side, in particular a vacuum side, and a second side, in particular an atmosphere side, of the vacuum feedthrough.

The first electrically conductive layer is applied to the outer surface of the first hollow cylinder. This electrically conductive layer can be made of a metal, in particular platinum.

The first hollow cylinder and the first electrically conductive layer protrude beyond the second hollow cylinder on the atmosphere side to form an electrically conductive contact surface. At the contact surface, the first electrode may be connected to, for example, a high voltage source such that the first electrically conductive layer may serve as an electrode for DBD plasma discharge. The first electrically conductive layer may be in the form of a hollow cylinder. The first electrically conductive layer can be segmented, i.e., for example, in the area in which it serves as an electrode for the DBD discharge and/or in the area of the feedthrough under the glass ring, it can be formed as longitudinal strips lying next to each other.

The first, second, and third hollow cylinders, as well as the first electrically conductive layer, extend beyond the lens element on the first side.

The elements each form a substantially annular zone of the sealing surface. The first ring made of glass adjoins the lens element radially outside and is connected to the lens element in a vacuum-tight manner. The first hollow cylinder is adjacent to and vacuum-sealed to the first ring radially outwardly, etc. In this arrangement, each layer has at least one adjacent layer of glass. The first and second rings of glass, and the second hollow cylinder, may in particular be made of fused glass. In particular, the fused glass may be a so-called solder glass, which is particularly suitable for making a vacuum-tight connection to a metal or ceramic. The metallic frame may be in the form of a ring. The metallic frame may, for example, have a flange which is designed to facilitate welding of the frame to further elements. The metallic frame can, for example, be made of a stainless austenitic steel, for example steel 1.4435 or steel 1.4404, which is characterized by high corrosion resistance.

The elements can each individually have the shape of a body of rotation with an axis of rotation. The elements can be arranged mutually coaxially with respect to their axes of rotation.

On the first side, i.e. for example on the vacuum side, the electrically conductive layer can be completely enclosed between the first and second hollow cylinders. In this case, only capacitive coupling to the electrode is possible on the vacuum side. Complete enclosure of the electrically conductive layer in insulating material has the advantage that the occurrence of an arc discharge can be prevented.

The third hollow cylinder made of ceramic has the effect of suppressing electrical breakdown through the second hollow cylinder made of glass in the event that the glass is not sufficiently breakdown resistant. For example, a discharge between a metal housing tube of a measuring device to be discussed below is successfully prevented by the third hollow cylinder made of ceramic. In particular, the third hollow cylinder can be made of an $Al_2O_3$ ceramic.

In one embodiment of the vacuum feedthrough, the lens element is made of sapphire.

Sapphire has a high transmittance in the wavelength range 200 nm to 5000 nm, making it particularly suitable for guiding electromagnetic radiation out of the optical range with little loss from a vacuum region. In particular, transmission in the ultraviolet range above 200 nm is high. Furthermore, sapphire is mechanically very robust.

In one embodiment of the vacuum feedthrough, the first hollow cylinder is made of sapphire.

The invention is further directed to an electrode assembly according to claim 5. An embodiment of the electrode assembly results from the features of claim 6.

The electrode assembly according to the invention is an electrode assembly for generating a DBD plasma discharge. The electrode assembly comprises the vacuum feedthrough according to the invention as discussed above. It further comprises a fourth hollow cylinder made of ceramic, which carries a second electrically conductive layer on its outer surface. The second electrically conductive layer may in particular be made of molybdenum.

The fourth hollow cylinder is arranged on the first side (the vacuum side) of the vacuum feedthrough coaxially with the first hollow cylinder. It lies at least partially inside the first hollow cylinder. The first and second electrically conductive layers partially overlap in the axial direction.

A gap with a radial extension remains open between the second electrically conductive layer and the inner surface of the first hollow cylinder.

The first and second electrically conductive layers form the two electrodes of the electrode assembly. During operation, a plasma discharge zone is formed in said gap, namely in the axial direction in the area where the two electrodes overlap.

The fourth hollow cylinder has the effect of sputter protection. It increases the service life of the electrode assembly. The fourth hollow cylinder can be made of an $Al_2O_3$ ceramic, for example. Another measure that has the effect of sputter protection is the choice of dimensions of the feedthrough. A large distance between the lens element and the region of the plasma discharge reduces the sputtering effect on the lens element. In particular, a large distance in relation to the diameter of the lens element is effective for this purpose.

In one embodiment of the electrode assembly, the radial extension of the gap is less than 1 mm. In particular, the radial extension of the gap may be between 0.05 mm and 0.5 mm. The inventors have recognized that with this expansion of the gap, the DBD plasma discharge can be ignited with a high frequency voltage in the kilovolt range (1-10 kV, 1-10 kHz) over a large pressure range. Operation in a pressure range of approx. 0.35-1500 Torr is possible.

Furthermore, the invention relates to a device according to claim 7.

The device according to the invention is a device for generating a DBD plasma discharge. The device comprises the electrode assembly according to the invention as discussed above. The gap between the second electrically conductive layer and the inner surface of the first hollow cylinder is in fluid dynamic communication with the interior of the vacuum chamber.

The first electrically conductive layer is electrically conductively connected to an AC high voltage source at the electrically conductive contact surface, and the second electrically conductive layer is electrically conductively connected to ground.

The electrode assembly can, for example, be installed in a metallic wall of a vacuum chamber, with the frame being welded vacuum-tight at its periphery to the wall of the vacuum chamber. Due to the large pressure range in which a DBD discharge is possible with the device according to the invention, operation of the device can also take place, for example, in ambient pressure, i.e. without a chamber which fluid-dynamically separates the first from the second side.

Still further, the invention is directed to a measuring device according to claim 8.

The measuring device according to the invention is a measuring device for characterizing a pressure and/or a gas composition.

The measuring device comprises the device according to the invention discussed above for generating a DBD plasma discharge. In addition, an optical sensor is arranged on the atmosphere side of the lens element.

The optical sensor is sensitive in the wavelength range which can be transmitted through the lens element. The optical sensor can be a simple radiation sensor, e.g. a light sensor, but it can also be a more complex optical sensor, e.g. a spectrometer. For example, a photodiode with a wavelength-selective filter can serve as an optical sensor.

The measuring device according to the invention is suitable, for example, for characterizing a pressure and/or gas composition within a vacuum chamber. The optimum use of the invention is in the pressure range of 0.35-1500 Torr (~2000 mbar), i.e. also in the pressure range at and above atmospheric pressure and is therefore widely applicable. The specific choice of materials used can be specifically adapted to vacuum requirements in accordance with the above embodiments. In particular, the use of sapphire as dielectric, of platinum and molybdenum as electrode material and of stainless steel for the frame contribute to the vacuum suitability of the measuring device. Furthermore, the materials mentioned are compatible with the typical requirements of a vacuum process plant in the semiconductor industry.

Further, the invention is directed to a method according to claim 9. This concerns a method for operating a measuring device according to the invention. In the method according to the invention, an alternating voltage having a voltage amplitude of 1 to 10 kilovolts and a frequency in the range of 1 to 10 kilohertz is applied between the first electrically conductive layer and the second electrically conductive layer. For example, the voltage waveform may change from −5 kV to +5 kV and back again over one period of the AC voltage, i.e., a voltage of 10 kVpp may be applied. For example, the voltage waveform may correspond to a sine wave. A square wave voltage is also possible. It is advantageous to vary the voltage from positive to negative with respect to ground potential. In this way, a much more stable plasma is obtained than, for example, by varying between 0 and positive voltage or between 0 and negative voltage.

When the voltage is applied, a plasma is ignited in the gap between the second electrically conductive layer and the dielectric in the region of the axial overlap of the two electrically conductive layers, which has only a short lifetime due to the accumulation of charge on the dielectric. By changing the sign of the applied AC voltage, the accumulated charge carriers are again moved away from the dielectric, so that a continuously appearing plasma can be maintained. The radiation emitted by the plasma is detected in the optical sensor.

Exemplary embodiments of the present invention are explained in further detail below with reference to figures, wherein:

FIG. 1 shows a longitudinal section of the central element of the invention, i.e. the vacuum feedthrough. The electro-optical vacuum feedthrough 10, constructed in radial layers, comprises a centrally arranged lens element 11 and, arranged around the lens element, the following further elements, enumerated in radial direction from inside to outside:

Figure 1:
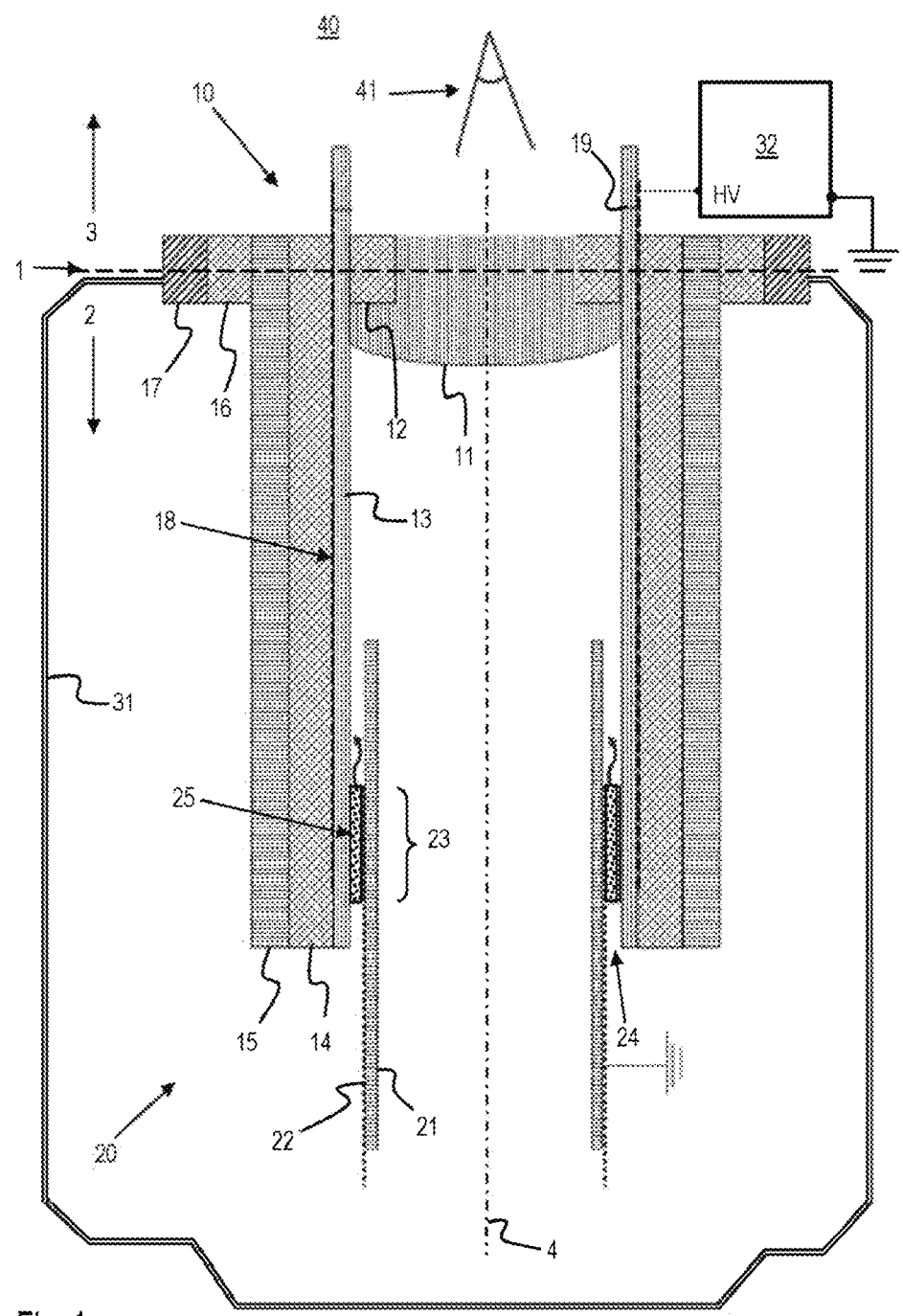
FIG. 1 shows schematically and partially as a cross-section a vacuum feedthrough according to the invention in connection with an embodiment of the electrode assembly, an embodiment of the device and an embodiment of the measuring device.

a first ring 12 made of glass,
a first hollow cylinder 13 made of a first dielectric material,
a second hollow cylinder 14 made of glass,
a third hollow cylinder 15 made of ceramic,
a second ring 16 made of glass,
a frame 17 made of metal.

Furthermore, a first electrically conductive layer 18 is applied to the outer surface of the first hollow cylinder, which may in particular be made of platinum.

A sealing surface 1 separates a first side 2, in this case the vacuum side, which comes to lie inside the vacuum chamber 31, from a second side 3, which in this case is the atmosphere side.

In the longitudinal section shown, the sealing surface 1 is intersected along a line which is shown as a dashed line. An optical sensor 41 and a high voltage source 32 are located on the atmosphere side of a vacuum chamber 31. A fourth hollow cylinder 21 and the second electrically conductive layer 22 attached to its outer surface complete the vacuum feedthrough to form an electrode assembly 20. In the embodiment shown, the elements of the electrode assembly are all in the form of bodies of revolution with a common axis of rotation 4 (dashed line).

A first electrically conductive layer 18 is connected to the high voltage source 32 at a contact surface 19. The second electrically conductive layer is connected to ground, so that the first and second electrically conductive layers form the two electrodes of the electrode assembly. The two electrodes overlap in an axial overlap region 23. In this overlap region and radially between the second electrically conductive layer 22 and the hollow cylinder 13, which may in particular be made of sapphire, a discharge region 25 is formed during operation (shown in dotted lines). Electromagnetic radiation, e.g. from the visible range, the UV range or the IR range, is emitted from this discharge region. In particular, this radiation can be emitted in the direction of the lens element in (shown by wavy arrows). It is this radiation which passes through the lens element 11 to the optical sensor 41 where it is detected.

The first 18 and second 22 electrically conductive layers may overlap in the axial direction, for example, 2-3 mm. The fourth hollow cylinder 21 may protrude, for example, about 5 mm beyond the second electrically conductive layer 22 toward the lens element. The shortest distance from the second electrically conductive layer 22 to the lens element 11 may be, for example, about 10 mm. These dimensions fit a discharge region with a radial extension of 0.05 to 0.5 mm, according to an embodiment described above. With the aforementioned spacing ratios, the sputter protection effect already mentioned above is created. In this assembly, particles knocked out of the electrode material by the discharge will with a high probability remain attached to the protruding ceramic surface of the fourth hollow cylinder and thus not contaminate the lens element. Radiation from the discharge region 25 can reach the lens element approximately parallel to the axis direction, even if the fourth hollow cylinder itself is not transparent to the radiation or is already contaminated by electrode material.

Shown is an embodiment of a measuring instrument or device in which the electrode assembly is installed in a metallic wall of a vacuum chamber 31, wherein the frame is welded in a vacuum-tight manner to the wall of the vacuum chamber at its periphery.

In particular, the vacuum chamber 31 and the wall, as well as the high voltage source 32 and optical sensor 41 are shown highly schematically and are not adapted to the dimensions of the electrode assembly. In particular, the vacuum chamber can be many times larger in relation to the vacuum feedthrough than shown. Also schematically and incompletely shown is the end of the fourth hollow cylinder and the second electrically conductive layer further away from the lens element. The axial ends of these two elements are shown offset from each other so that the two layers can be clearly seen. However, the two elements may extend further in the axial direction than shown, and the second electrically conductive layer may in particular rest on the fourth hollow cylinder over its entire length. A mechanical fastening device, not shown, holds the fourth hollow cylinder in position.

Figure 2:
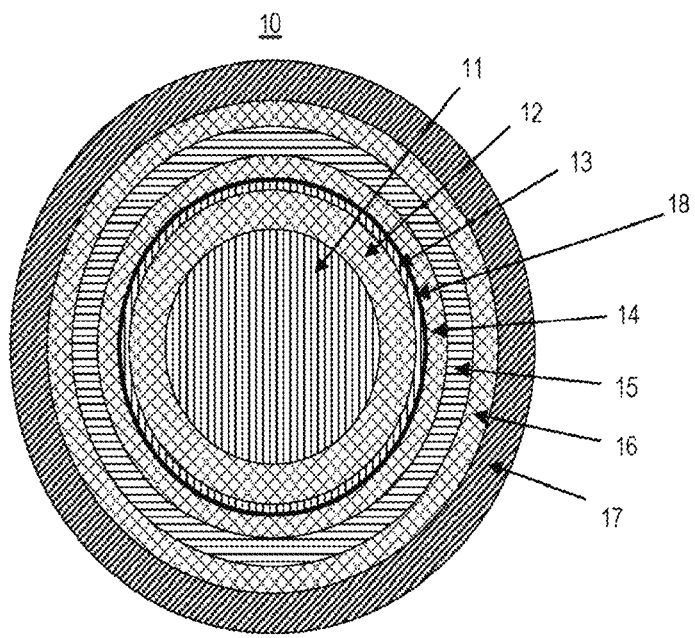
FIG. 2 shows a cross-section through the vacuum feedthrough according to the invention along the sealing surface.

FIG. 2 shows a cross-sectional view of the vacuum feedthrough 10. In a preferred embodiment, the sequence of materials from inside to outside is: sapphire (vertically cross-hatched), glass (diagonally cross-hatched), sapphire, platinum (black), glass, ceramic (horizontally cross-hatched), glass, metal (diagonally cross-hatched). The first electrically conductive layer 18 is electrically isolated from the metallic frame 17. The elements of the feedthrough structured in a shell-shaped manner are each connected to the adjacent elements in a vacuum-tight manner.

Figure 3:
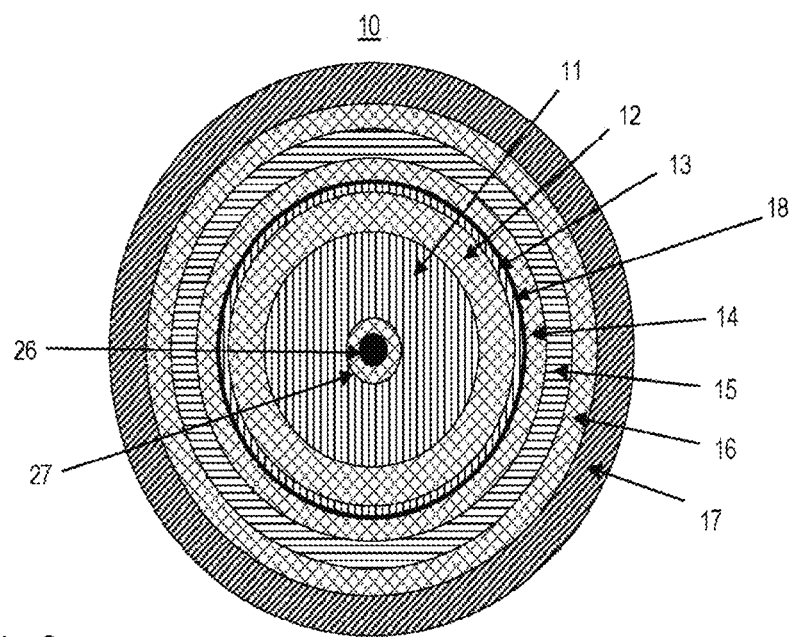
FIG. 3 shows a cross-section through an embodiment of the vacuum feedthrough along the sealing surface.

FIG. 3 shows a cross-sectional view of an embodiment of the vacuum feedthrough 10 which has an additional central electrode 26 through the lens element. The additional electrode is glazed into the lens element by means of an additional ring 27. The additional electrode may be rod-shaped or wire-shaped and project beyond the feedthrough on both sides, i.e., on the vacuum side and on the atmosphere side.

Figure 4:
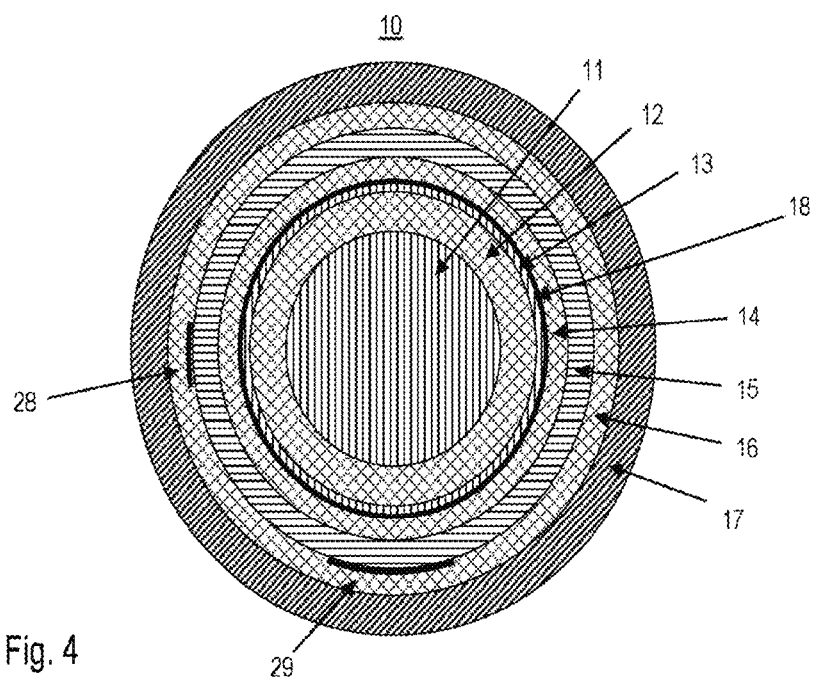
FIG. 4 shows a cross-section through another embodiment of the vacuum feedthrough along the sealing surface.

FIG. 4 shows a cross-section through an embodiment of the vacuum feedthrough 10 which has further electrodes 28, 29 arranged radially in the region of the second ring 16 made of glass. Exemplarily, two further electrodes are shown here, but a plurality of such electrodes may be arranged in the form of azimuthally spaced strips with a longitudinal direction parallel to the axis of the hollow cylinders on this radius. For example, one of these further electrodes may replace the central electrode 26 of the exemplary embodiment shown in FIG. 3. In a further embodiment, the central electrode of FIG. 3 can also be combined with further electrodes arranged radially further out as shown in FIG. 4. The further electrodes 28, 29 can, for example, be applied as thin metallizations to the hollow cylinder 15 made of ceramic and be encased in a vacuum-tight manner by the second ring 16 made of glass on the side facing away from the ceramic cylinder. Various metals can be used as materials for the further electrodes, in particular platinum, molybdenum and titanium. Via the further electrodes, for example, further plasma chambers and/or sensors can be electrically contacted on the vacuum side, for example a cold cathode vacuum manometer or a Pirani pressure sensor. In order to enable electrical contact on such further electrodes on the outside, the ceramic cylinder 15 can, for example and in deviation from the illustration in FIG. 1, also project beyond the ring 16 on the side of the vacuum feedthrough facing away from the vacuum side and thus also form a contact surface for the further electrodes on this side and enable electrical contacting on the radially outer side. Such further electrodes can, for example, be covered over their entire length with an insulating layer. This has the advantage that in electron/ion optics often undesirable open potentials, which could influence charged particles, are avoided. For this purpose, for example, a glass ring lying over the electrodes can be further extended axially, or individual conductor tracks can be realized with a thin glass layer overlapping the respective conductor track.

In summary, the present invention enables pressure measurement or gas analysis in the range 0.35 Torr to 1500 Torr, i.e., up to the overpressure range, for example, using a cylindrical sapphire high-voltage feedthrough with an integrated lens system. A DBD plasma can be ignited by applying an AC voltage in the range 1-10 kilovolts and with a frequency in the range 1-10 kilohertz. The invention provides a small, energy efficient and flexible gas analyzer with high sensitivity and for a wide variety of applications.

LIST OF REFERENCE SIGNS

1 Sealing surface
2 First side (vacuum side)
3 Second side (atmosphere side)
4 Common axis
5 Vacuum feedthrough
11 Lens element
12 First ring (glass)
13 First hollow cylinder (first dielectric material)
14 Second hollow cylinder (glass)
15 Third hollow cylinder (ceramic)
16 Second ring (glass)
17 Frame (metal)
18 First electrically conductive layer
19 Contact surface
20 Electrode assembly
21 Fourth hollow cylinder (ceramic)
22 Second electrically conductive layer
23 Axial overlap area
24 Gap
25 Discharge zone in the gap
26 Additional (central) electrode
27 Additional ring (glass)
28, 29 Other electrodes
30 Device
31 Vacuum chamber
32 AC high voltage source
40 Measuring device
41 Optical sensor

The invention claimed is:

1. Vacuum feedthrough (10) comprising the elements
lens element (11),
first ring (12) made of glass,
first hollow cylinder (13) made of a first dielectric material,
first electrically conductive layer (18),
second hollow cylinder (14) made of glass,
third hollow cylinder (15) made of ceramic,
second ring of glass (16),
frame (17) made of metal,
in the above sequence radially from inside to outside, wherein at least one continuous radiation path exists for radiation from an optical wavelength range starting from a first point on a first side (2) of the vacuum feedthrough, through the lens element to a second point on a second side (3) of the vacuum feedthrough.

2. Vacuum feedthrough (10) according to claim 1, wherein adjoining elements (11, 12, 13, 14, 15, 16, 17) are connected to one another in a vacuum-tight manner to form a sealing surface (1) which separates the first side (2) and the second side (3) of the vacuum feedthrough from one another, wherein a first electrically conductive layer (18), in particular of platinum, is applied to the outer surface of the first hollow cylinder,
wherein the first hollow cylinder and the first electrically conductive layer on the second side protrude beyond the second hollow cylinder to form an electrically conductive contact surface (19),
wherein the first, second and third hollow cylinders and the first electrically conductive layer on the first side protrude beyond the lens element.

3. Vacuum feedthrough (10) of claim 1, wherein the lens element (11) is made of sapphire.

4. Vacuum feedthrough (10) according to claim 1, wherein the first hollow cylinder (13) is made of sapphire.

5. Electrode assembly (20) for generating a DBD plasma discharge, wherein the electrode assembly comprises the vacuum feedthrough (10) according to claim 1, and further comprises a fourth hollow cylinder (21) made of ceramic which carries on its outer surface a second electrically conductive layer (22), in particular of molybdenum,
wherein the fourth hollow cylinder (21) is arranged on the first side (2) of the vacuum feedthrough coaxially with the first hollow cylinder (13) and lies at least partially inside the first hollow cylinder, wherein the first and the second electrically conductive layer partially overlap in the axial direction, and wherein a gap (24) with a radial extension remains open between the second electrically conductive layer and the inner surface of the first hollow cylinder.

6. Electrode assembly (20) according to claim 5, wherein the radial extension of the gap (24) is less than 1 mm, in particular wherein the radial extension of the gap is between 0.05 mm and 0.5 mm.

7. Device (30) for generating a DBD plasma discharge, wherein the device comprises the electrode assembly (20) according to claim 5, wherein the gap between the second electrically conductive layer and the inner surface of the first hollow cylinder is in fluid dynamic communication with the interior of the vacuum chamber, wherein the first electrically conductive layer is electrically conductively connected to an AC high voltage source (32) at the electrically conductive contact surface, and wherein the second electrically conductive layer is electrically conductively connected to ground.

8. Measuring device (40) for characterizing a pressure and/or a gas composition, wherein the measuring device comprises the device according to claim 7 and wherein an optical sensor (41) is arranged on the atmosphere side (3) of the lens element (11).

9. Method for operating a measuring device (40) according to claim 8, wherein an AC voltage having a voltage amplitude of 1 to 10 kilovolts and a frequency in the range of 1 to 10 kilohertz is applied between the first electrically conductive layer (18) and the second electrically conductive layer (22).

* * * * *